(12) United States Patent
Gauthier, Jr. et al.

(10) Patent No.: US 8,230,382 B2
(45) Date of Patent: Jul. 24, 2012

(54) MODEL BASED SIMULATION OF ELECTRONIC DISCHARGE AND OPTIMIZATION METHODOLOGY FOR DESIGN CHECKING

(75) Inventors: Robert J. Gauthier, Jr., Hinesburg, VT (US); Bradford L. Hunter, Austin, TX (US); Amol A. Joshi, Essex Junction, VT (US); Junjun Li, Williston, VT (US); Gregory Joseph Schroer, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 252 days.

(21) Appl. No.: 12/695,494

(22) Filed: Jan. 28, 2010

(65) Prior Publication Data

US 2011/0185332 A1    Jul. 28, 2011

(51) Int. Cl.
*G06F 17/50* (2006.01)
(52) U.S. Cl. ........ 716/136; 716/106; 716/112; 716/132; 703/14
(58) Field of Classification Search .................. 716/106, 716/112, 132, 136; 703/14
See application file for complete search history.

(56) References Cited

U.S. PATENT DOCUMENTS

| | | | |
|---|---|---|---|
| 6,493,850 B2 | 12/2002 | Venugopal et al. | |
| 6,526,548 B1 | 2/2003 | Voldman | |
| 6,725,439 B1 | 4/2004 | Homsinger et al. | |
| 7,024,646 B2 | 4/2006 | Logie et al. | |
| 7,134,099 B2 | 11/2006 | Collins et al. | |
| 7,243,317 B2 | 7/2007 | Wang et al. | |
| 7,451,414 B2* | 11/2008 | Groos | 716/136 |
| 2011/0016440 A1* | 1/2011 | Bergmann et al. | 716/106 |

OTHER PUBLICATIONS

Baird et al.; "VerifyESD: A Tool for Efficient Circuit Level ESD Simulations of Mixed-Signal ICs"; Electrical Overstress/Electrostatic Discharge Symposium Proceedings 2000; Publication Year: 2000, pp. 465-469.*

* cited by examiner

*Primary Examiner* — Naum Levin
(74) *Attorney, Agent, or Firm* — Wood, Herron & Evans, LLP; Anthony J. Canale (57) ABSTRACT

A method, apparatus and program product are provided for simulating a circuit. A plurality of elements of the circuit is represented by device models including pass/fail criteria. A circuit simulation program is executed on a hardware implemented processor where the circuit simulation program is configured to obtain simulation results from the device models in response to applied parameters. The circuit simulation program identifies a failure of one or more of the plurality of elements of the circuit based on the pass/fail criteria of the device models. The circuit simulation program is further configured to output the failures during simulation of the one or more of the plurality of elements that are identified in response to the applied parameters.

20 Claims, 9 Drawing Sheets

```
ComplexDevice (node1 node2, node3, node4)
parameters param1, param2, param3 component_1 (node1 internalnode1 internalnode2) parameterlist
component_2 (node2 internalnode3 internalnode4) parameterlist
component_3 (node3 internalnode5 internalnode6) parameterlist
...
component_n (node4 internalnoden1 internalnoden2)
parameterlist if { voltage(internalnodex, internalnodey) > critical_voltage1 }
        print devicename, devicetype, devicevoltage,
devicecurrent
endif if { current(internalnodex, internalnodey) > critical_current1 }
        print devicename, devicetype, devicevoltage,
devicecurrent
endif end ModelName=
```

148 — (upper brace)
150 — (lower brace)

MODEL BASED SIMULATION OF ELECTRONIC DISCHARGE AND OPTIMIZATION METHODOLOGY FOR DESIGN CHECKING

BACKGROUND

The present invention relates generally to electrical circuits, and more specifically, to the simulation of electrostatic discharge.

A modern integrated circuit may communicate by utilizing a number of different input and output signal standards. For example, an integrated circuit may transmit and receive information via one or more input/output circuits, which may be within the same input/output bank, at high speeds (e.g. 1 Gpbs). The input/output circuit typically must also be designed to be protected from (e.g., have a certain immunity to damage from) electrostatic discharge.

In general, an input/output circuit design may be very complex and involve difficult compromises between performance (e.g., speed or data rate) and electrostatic discharge (ESD) protection. For example, a typical input/output circuit design process may involve adding standard, pre-approved ESD protection devices to the input/output circuit. The ESD protection device and the input/output circuit, for example, would then be implemented in silicon and tested to determine if the circuit meets design specifications.

After testing, it may be determined that the selected ESD protection device was not optimum for the desired application, such as for example being too large or in an incorrect configuration, and the process would have to be repeated such as by selecting another ESD protection device or reconfiguring the current design for further testing. In general, this approach is time consuming and expensive with results that are often difficult to predict.

Simulation of circuits may assist in designing circuits with ESD or other protection devices by predicting behavior of such circuits. However, contemporary simulations may run for long periods of time, providing little or no information to the Design Engineer until the simulations are complete and then require a manual interpretation of the simulation results to identify critical parameters and/or critical paths. After analyzing the results, the Design Engineer may then go back to the design and make changes based on feedback from the results, though results traditionally only provide worst case scenarios and the Design Engineer has little insight as to where the next problem or critical area in the design may lie.

Therefore there is a need in the art to improve upon simulation as a predictor for performance of a circuit.

BRIEF SUMMARY

Embodiments of the invention include a method, apparatus and program product for simulating a circuit to obtain responses of the elements of the circuit and determine items such as, but not limited to, sensitivities of elements to parameters applied to the circuits and failure of elements in response to the parameters applied to the circuits. A plurality of elements of the circuit is represented by device models including pass/fail criteria. A circuit simulation program is executed on a hardware implemented processor where the circuit simulation program is configured to obtain simulation results from the device models in response to applied parameters. The circuit simulation program identifies a failure of one or more of the plurality of elements of the circuit based on the pass/fail criteria of the device models. The circuit simulation program is further configured to output the failures, during simulation, of the one or more of the plurality of elements that are identified in response to the applied parameters.

According to one embodiment, the device models are based on testing of a physical form of the plurality of elements and failure criteria under failure conditions. In some embodiments, the failures output during the simulation may identify a critical path or component. In a particular embodiment, the applied parameters include generating a series of ESD stimulus to the circuit, and the failures output during the simulation identify an ESD critical path and a failure mode.

In some embodiments, the circuit is analyzed by sweeping through and applying a plurality of critical design parameters, where the sweep uses a known parameter-failure cross-reference table. An optimization of the circuit may then be performed including performing design iterations to optimize the circuit design. According to one embodiment, the optimization may be performed as an optimization loop utilizing a numerical optimizer.

In some embodiments, the circuit may include a portion of chip design with critical environmental variables for a local analysis. In other embodiments, the circuit may represent a full chip design including critical environmental variables for a full chip analysis.

DETAILED DESCRIPTION

Embodiments of the invention enable Design Engineers to use simulation-based I/O circuit design in order to achieve satisfactory ESD protection levels earlier in the design process. Based on the fragile nature and ever growing number of devices on chips, there is a need for chip protection. Many contemporary practices do not employ simulation, but rather trial and error approaches, and historically only ESD ground rules and ESD device data are provided for customer use. However, accurate ESD prediction requires accurate ESD high current models for ESD transient event simulation.

Embodiments of the invention assist in enabling ESD simulation-based checking tools for use with ESD protection circuit design and verification. Embodiments may also provide the capability of using industry standard circuit simulators, such as SPICE, or even internally developed circuit simulators to qualify cell libraries and to predict ESD chip failure. ESD compact model simulations along with ESD Design Rule Checks ("DRC") and ESD p-cell layout assist in ensuring first time-ESD-pass for a chip design. These tools move ESD circuit designs from the "black magic" belief many Design Engineers still have today to a standard circuit design process. However, ESD protection design becomes more and more challenging in advanced technologies. Shorter channel length, thinner oxide, higher metal resistance, etc. add to the problems while ESD targets remain the same. For example, for 90 nm and beyond, ESD protection requires tool-assisted early chip floor planning as well as final chip analysis. In order to be successful, ESD results require simulation-based ESD protection design. Plug-and-play and other ad hoc ESD solutions are no longer sufficient.

Some embodiments of the invention address ESD protection; however, the methodology implemented in the embodiments of the invention is applicable to many areas other than ESD, such as electromagnetic ("EM")/hot electron, floor planning for density checking, chip temperature analysis, Charged Device Model ("CDM") packaging analysis, among many others. As each of these scenarios involves a failure analysis, they will generally be referred to as failure criteria and/or failure conditions each having some set of pass/fail criteria. Unlike contemporary failure prediction methodologies, failure detection of the embodiments of the invention occurs real-time within the circuit simulations themselves. Post-simulation processing may not be needed to identify failures; however, post-simulation processing may still provide other data important to a Design Engineer.

Figure 1:
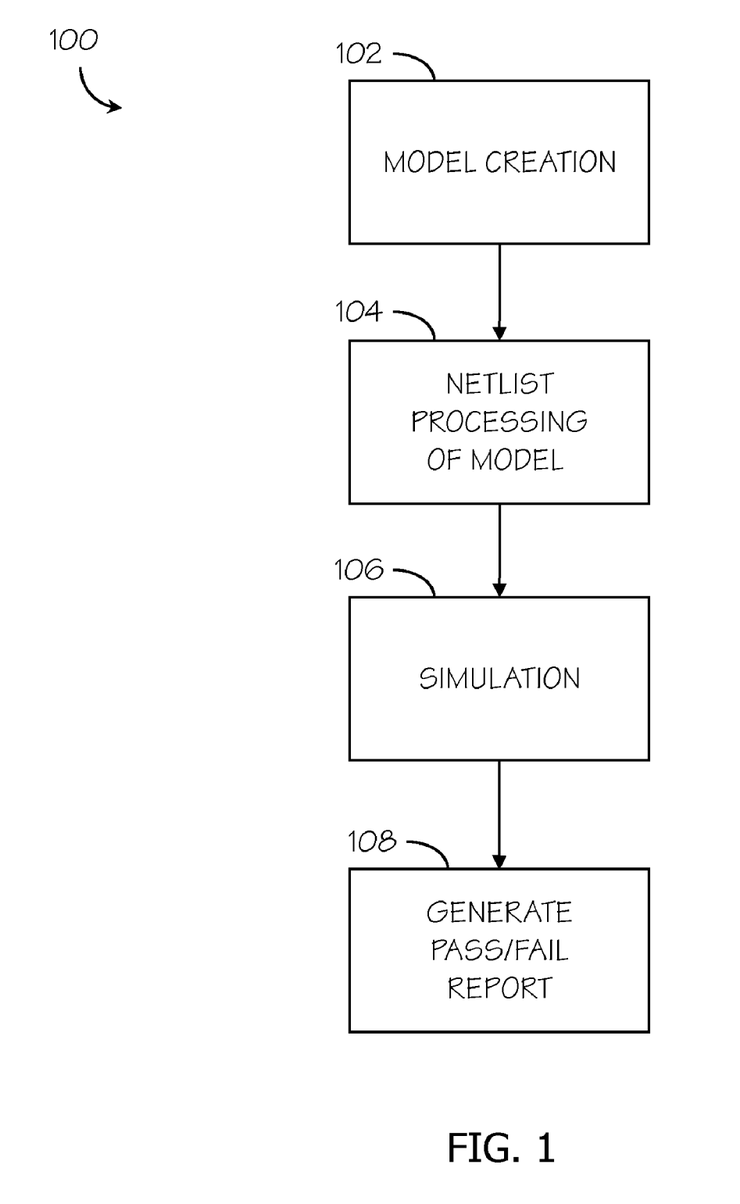
FIG. 1 is a flowchart illustrating an overview of failure prediction implemented within embodiments of the invention.

Turning now to FIG. 1, the flowchart 100 illustrates an overview of the failure prediction implemented within embodiments of the invention. Simulation model data representing the circuit design, simulation parameters, critical parameters and pass/fail criteria, and device models is created (block 102). The simulation model data is sent to a netlist processor to create a net list and other parameters for simulation in either a commercial or internal circuit simulator (block 104). A simulation is performed on the information sent from the netlist processor (block 106). With the device models used, the circuit simulator is able to identify both failures of components as well as near failures of components. Furthermore, using the failure data, the circuit simulators are also able to identify critical paths within designs for a particular set of inputs. Generally this sequence is run through a series of parameter settings and the results from all of the analyses may be reported in a pass/fail report from the simulation data (block 108).

Figure 2:
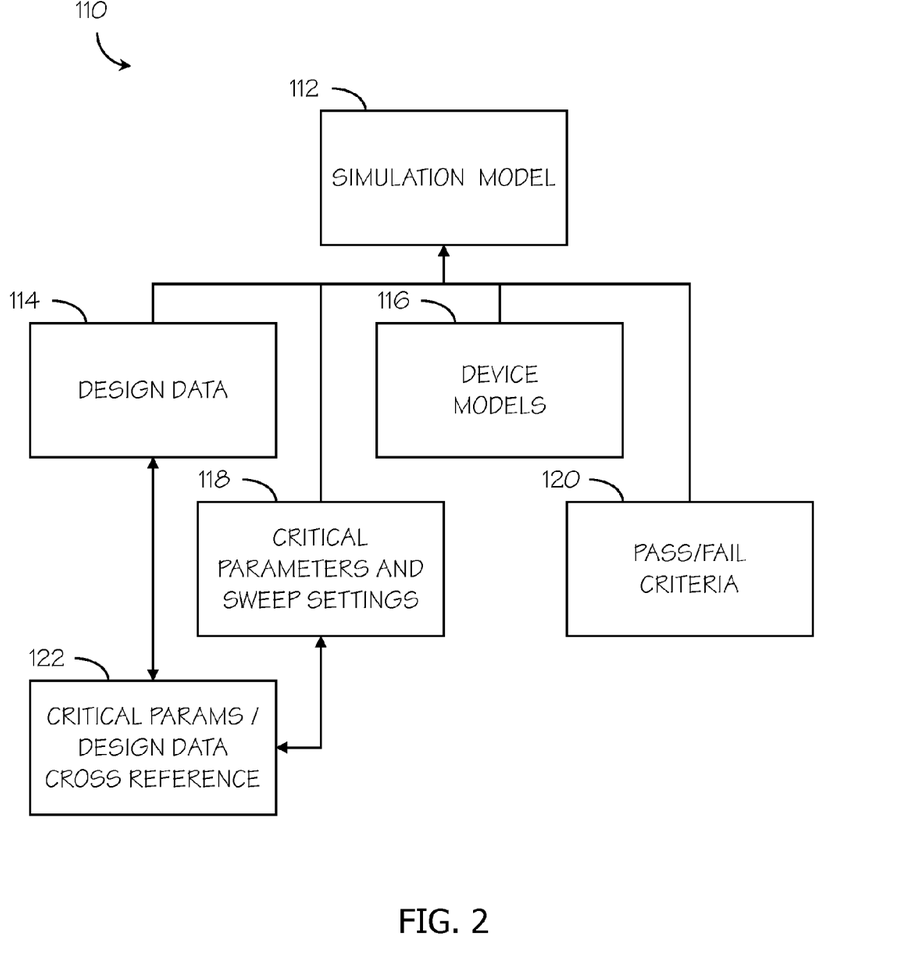
FIG. 2 is a block diagram representing components of a circuit model for simulation.

In order to be able to identify failures and critical paths within the circuit simulator, in some embodiments, additional information may be built into the device model data. As seen in FIG. 2, the simulation model (block 112) includes circuit design data (block 114) from the design engineer, such as the exemplary circuit 130 shown in FIG. 3. The circuit design data may include the circuit layout provided by the design engineer for simulation and testing. These circuits may represent portions of a chip design or a full chip layout. Circuits such as circuit 130 may proceed through many design iterations, adding, deleting, or modifying components before the actual circuit product is commercialized. The circuit design may include different types of circuit elements 132 as well as devices 134, grounds, and power sources (not shown) as would be known by one of ordinary skill in the art.

Figure 3:
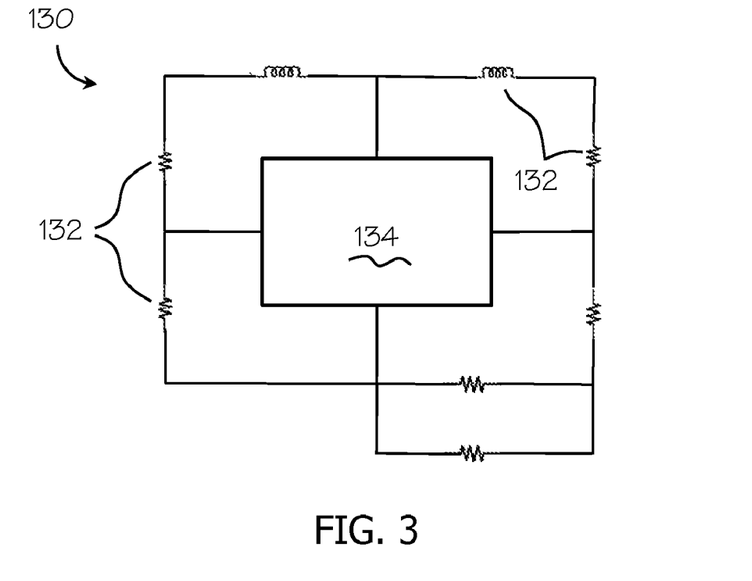
FIG. 3 is an exemplary circuit containing a device.
Figure 4A:
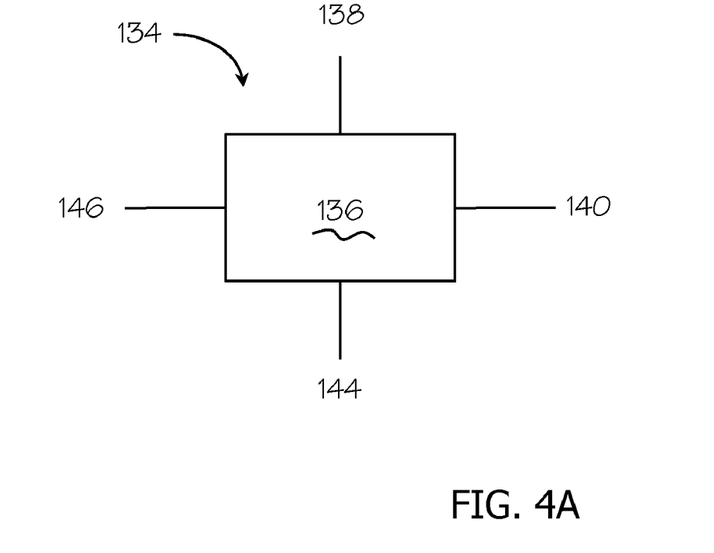
FIG. 4A is a graphical representation of the device removed from the circuit of FIG. 3.
Figure 4B:
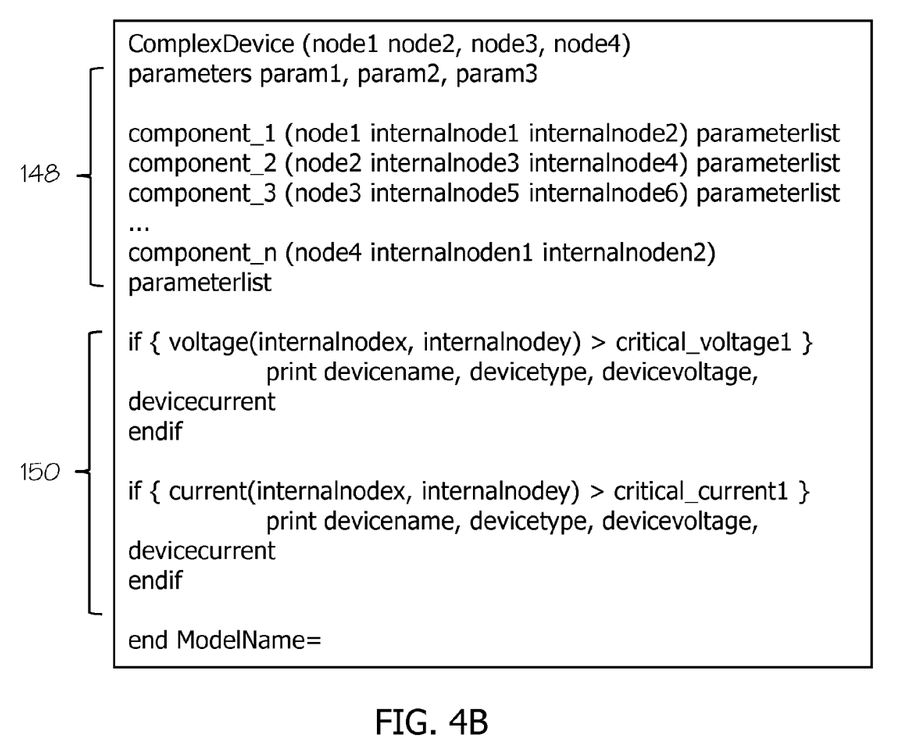
FIG. 4B is an exemplary device model of the device in FIG. 4A.

The simulation model includes device models (block 116) for each device 134 in the designed circuit 130, which may be retrieved from a library of device models. These device models contain component level models for devices in the design data. For example, device 134 in FIG. 3 is shown in FIG. 4A with data that may be given to the circuit model during simulation. Device 134 may be represented by a device model 136 with four nodes 138-144, which may in turn provide power or other parameters to the circuit 130 or they may simply be data lines. An example of a device model used in the circuit simulations may be seen in FIG. 4B. The device 134 may be defined by components with parameters 148, which may in-turn also be components with their own parameters. Once the circuit 130 is built and the device models and parameters 134, 148 are retrieved, simulations may be run on the simulation models.

Returning to FIG. 2, additionally, critical parameters and sweep settings (block 118) are included in the simulation model, which assist in controlling and driving the simulation. Critical parameters may be identified from the parameters 148 in the simulation models and may include environmental parameters such as on chip wiring to pin connections. For example, core pin wiring may be significant when including signals from pins AVDD and/or AVSS (analog power supply input terminals). Critical parameters may be determined, in some cases, based on performance data or design objectives of the circuits. Results from these parameters may provide sensitivities to other parts of the circuit and may illustrate potential variances in designs caused by, for example, sensitivities to wire resistances. In such cases, sweep settings may be set up to sweep resistances, for example, between AVSS and ground or between AVDD and ground. Sensitivities may then be determined for wiring resistance from core ground AVSS anti-parallel diodes to chip digital ground. Further sensitivities may be determined for resistance from core power AVDD RC-Clamp ground to chip ground. Additionally, sensitivities may be determined for wiring resistance from core signal-pin snap-back device ground to chip digital ground. Other parameter sweeps and sensitivities may also be determined related to package parasitic models for CDM simulations, for example.

Design engineers may also incorporate pass/fail criteria 150 (block 120) into the circuit device models representing semiconductor devices. Pass/fail criteria 150 may be selected by the circuit designer and is generally driven by the specification of the circuit design and its intended mode of operation. By building the pass/fail criteria 150 directly into the circuit device models, design engineers are able to receive instant feedback from the circuit simulation program instead of having to wait for one or multiple simulations to complete and then to use post-processing tools on the simulation results to determine not only at which component the results of the simulation indicate a failure, but also the failure type information, and where in the range of swept parameters, the failures occurred. Building the failure criteria into the device models also assists in setting up a complete optimization loop for a circuit design where the results of one simulation drive changes to parameters in the next simulation iteration in an effort to minimize or maximize some objective function of the optimization. Linking the results of the simulation to design variables of the circuit through critical parameters may assist in performing optimization on the circuit. A cross-reference between critical parameters and design data (FIG. 2, block 122) may also be included to assist in providing guidance to the design engineer in making decisions as to how redesign a circuit to make improvements and reach desired design objectives.

Figure 5:
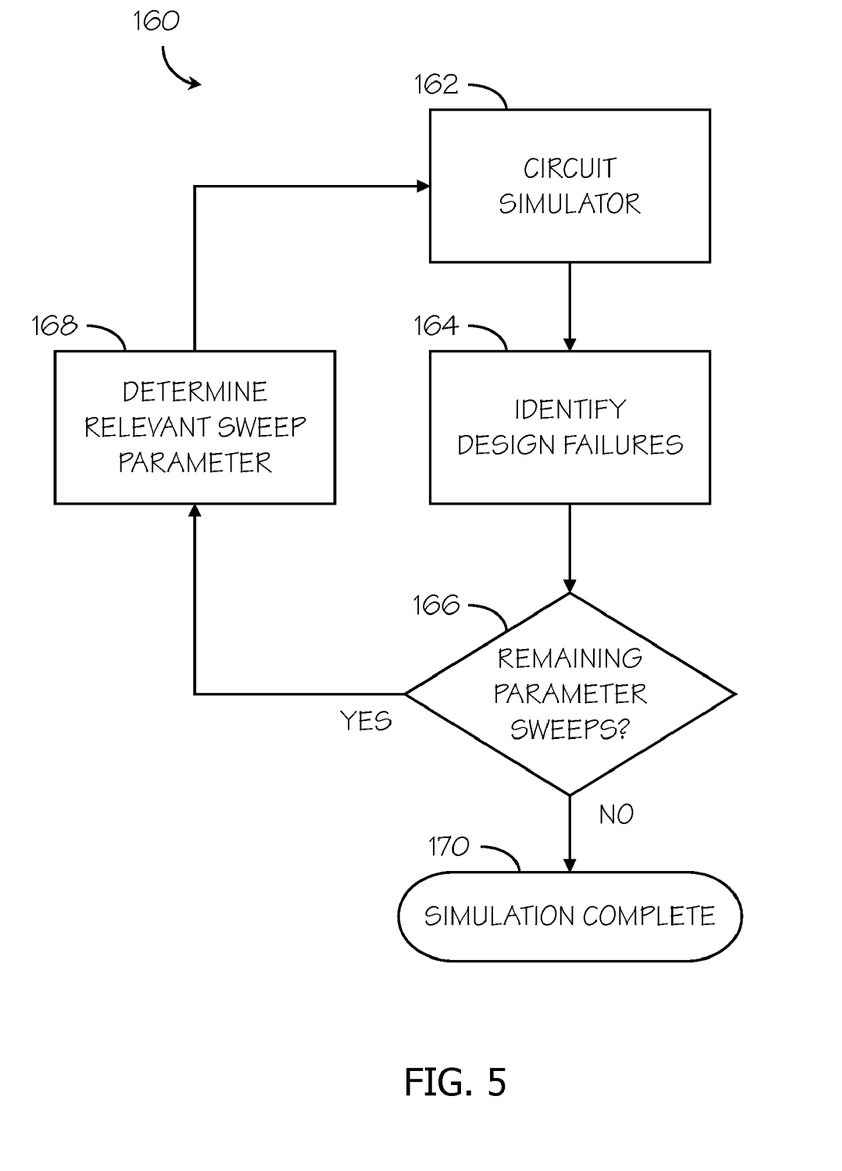
FIG. 5 is a simplistic view of a simulation loop.

FIG. 5 illustrates a simplistic view of the simulation loop that runs through all of the values of the sweep parameters. The flowchart 160 in FIG. 5 illustrates the process after the design engineer has completed the circuit design. A newly designed circuit is simulated in the circuit simulation program with critical parameters and sweeps defined as above (block 162). During the simulation, design failures may be identified by pass/fail criteria 150 built into the circuit device models (block 164). If remaining sweeps exits ("YES" branch of decision block 166), then the sweep parameters are advanced (block 168) and the next circuit simulation is performed (block 162). If there are no sweep parameters remaining ("NO" branch of decision block 168), then the simulation is complete.

Once the simulation is complete, post processing functions may be performed. Results such as those shown in flowchart 180 in FIG. 6, may be processed at the end of the simulations.

Figure 6:
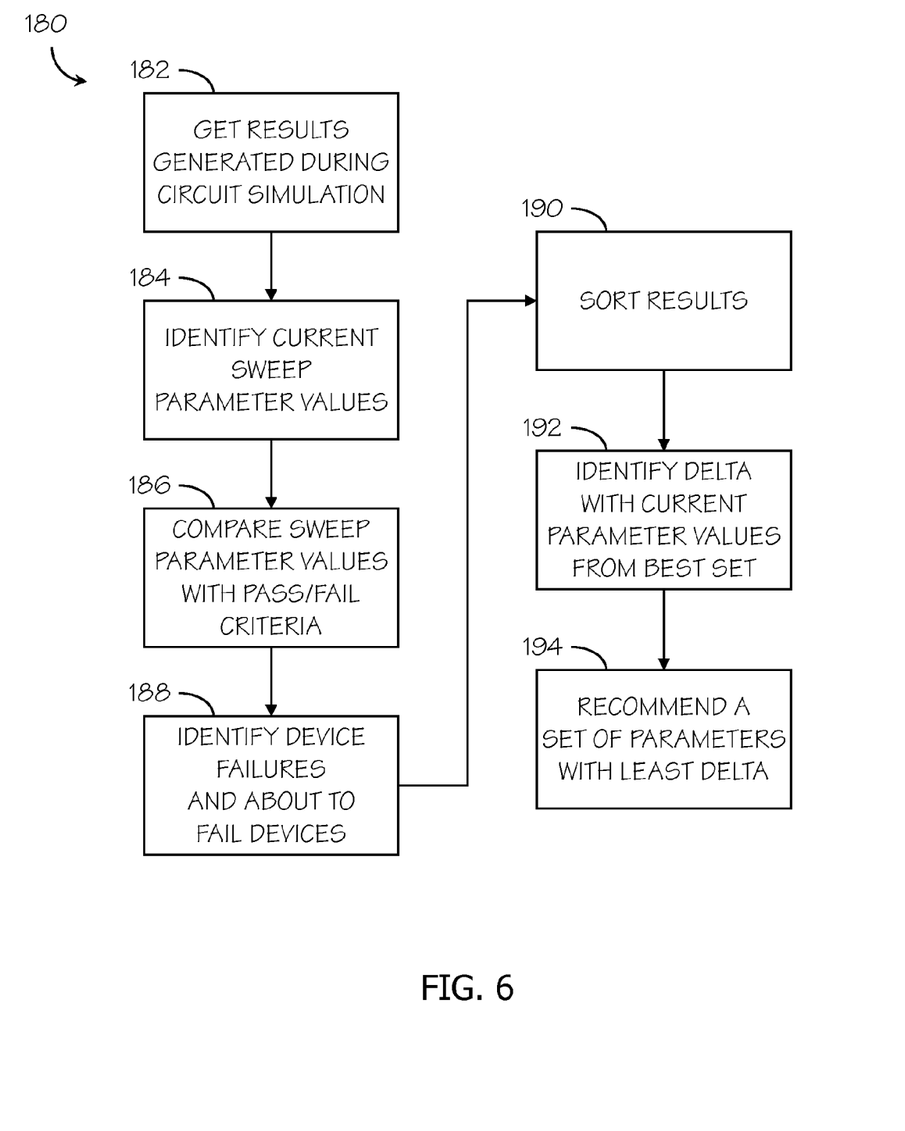
FIG. 6 is a flowchart for post processing functions that may be performed.
Figure 7:
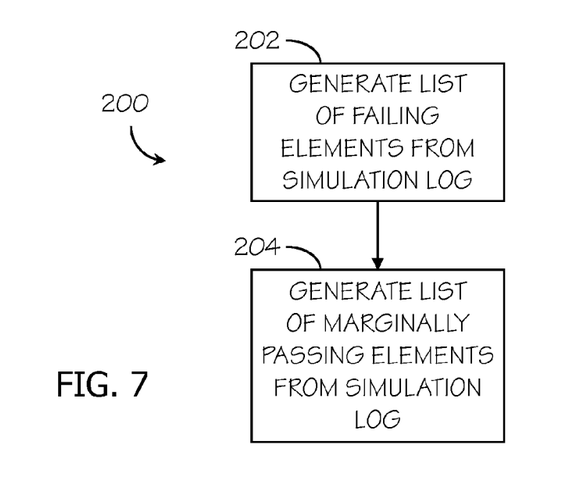
FIG. 7 is a flowchart for determining failures or near failures of an analysis.

Results are first retrieved from the completed simulations (block 182). Parameter values for each of the sweeps are identified (block 184). The identified parameter values may then be compared to the pass/fail criteria (block 186) and used to identify devices that have failed or are about to fail (block 188). Results may then be sorted with the most critical issues at the top of the list (block 190). Identification of large deltas resulting from comparisons (192) of current values to desired values may assist in determining critical paths within the circuit and these critical paths may then guide the Design Engineer in determining redesigns or fixes to the potential problems of the current circuit design. Smaller delta values may also be identified. Finally, as shown in flowchart 200 in FIG. 7, a list of elements that are failing may be identified from the simulation in the simulation log (block 202). Additionally, a list of generally marginally passing elements may also be identified (block 204).

Figure 8:
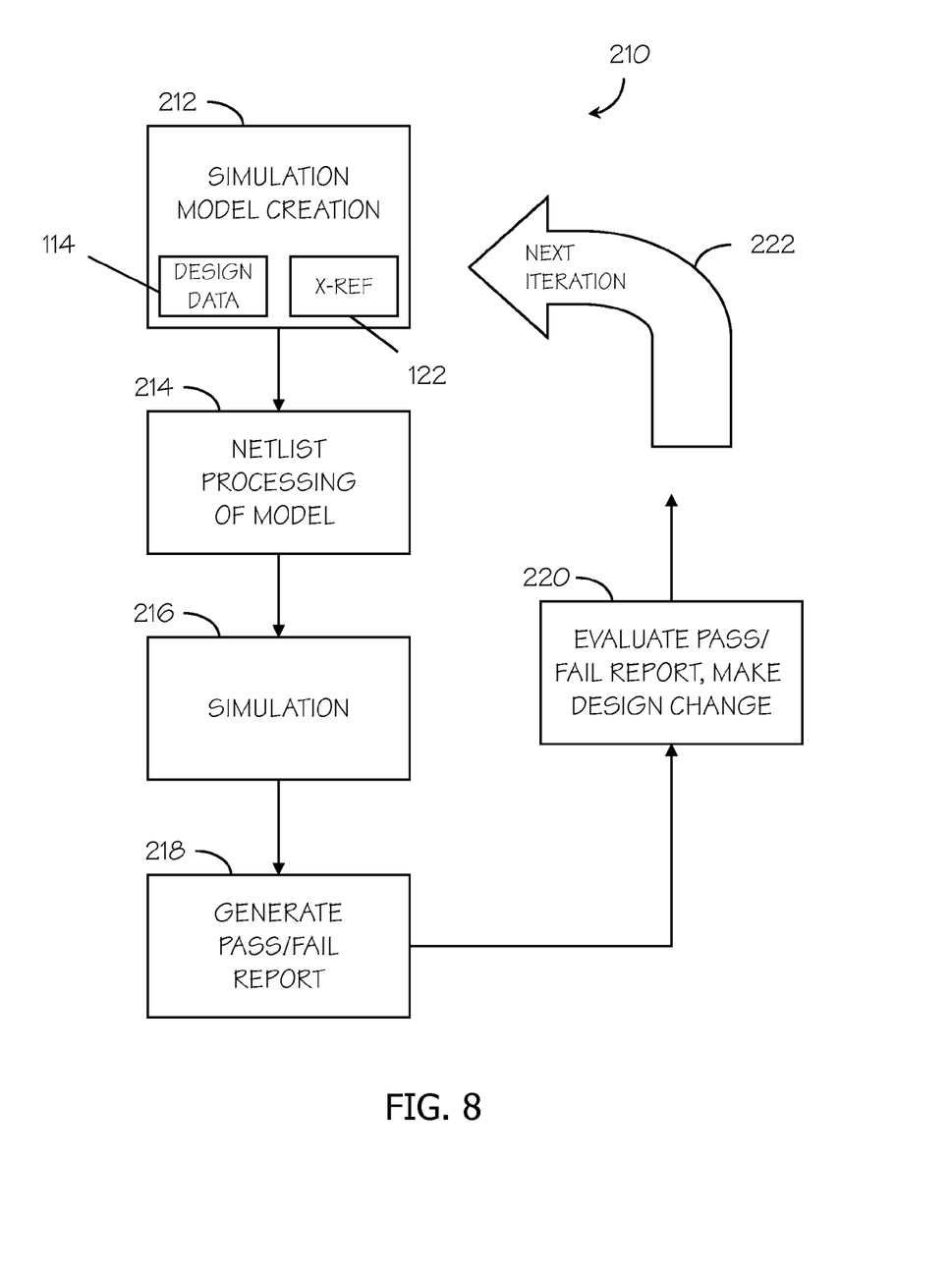
FIG. 8 is a block diagram of a manual iterative process of circuit design by a Design Engineer.

Summing up the overall process in the flow diagram 210 in FIG. 8, the Design Engineer develops the simulation model (block 212) trying to meet the functional requirements and restrictive constraints of the design, including the design data 114 and cross references between the design data and critical parameters 122 of the design. Next the model is sent for netlist processing (block 214) which converts the design with the simulation models representing the design elements into an input list file suitable for processing in a circuit simulator, such as SPICE or other proprietary simulators. The simulation is performed (block 216), sweeping through all of the values of parameters set by the Design Engineer, producing intermediate failure or near failure data. At the completion of the simulation, a pass/fail report may be generated (block 218). The Design Engineer may then evaluate the pass/fail report (block 220), review the intermediate output produced during the simulation and use that information to make a design change. Critical paths and components may be identified by the reports and output which allow the Design Engineer to intelligently adjust components and parameters in the model creating a subsequent iteration (block 222) of the design. The process then continues until a target design criteria is met or until the Design Engineer determines that the circuit is either acceptable or unable to meet design requirements.

This manual iterative process may in some embodiments be implemented in an optimization loop where in addition to the models and parameters normally supplied by the Design Engineer, additional data related to the optimization may also be supplied. This information may include an optimization objective (block 232) as seen in the diagram 230 in FIG. 9. During simulation model creation (block 234), design data 114, critical parameters 118, and cross-referencing 122 may be supplemented with additional optimization data such as design constraints, which define limits for a numerical optimizer. After simulation model creation, as above, the simulation model proceeds through netlist processing (block 236) and into simulation (block 238). Because pass/fail criteria is now built into the simulation, rather than a post processing function, the simulator produces pass/fail or marginal pass data, which is calculated during each simulation pass responsive to a particular set of parameters. The simulator may additionally be used to calculate sensitivities of components to the set of parameters, which then may be shared with an optimizer (block 240).

Figure 9:
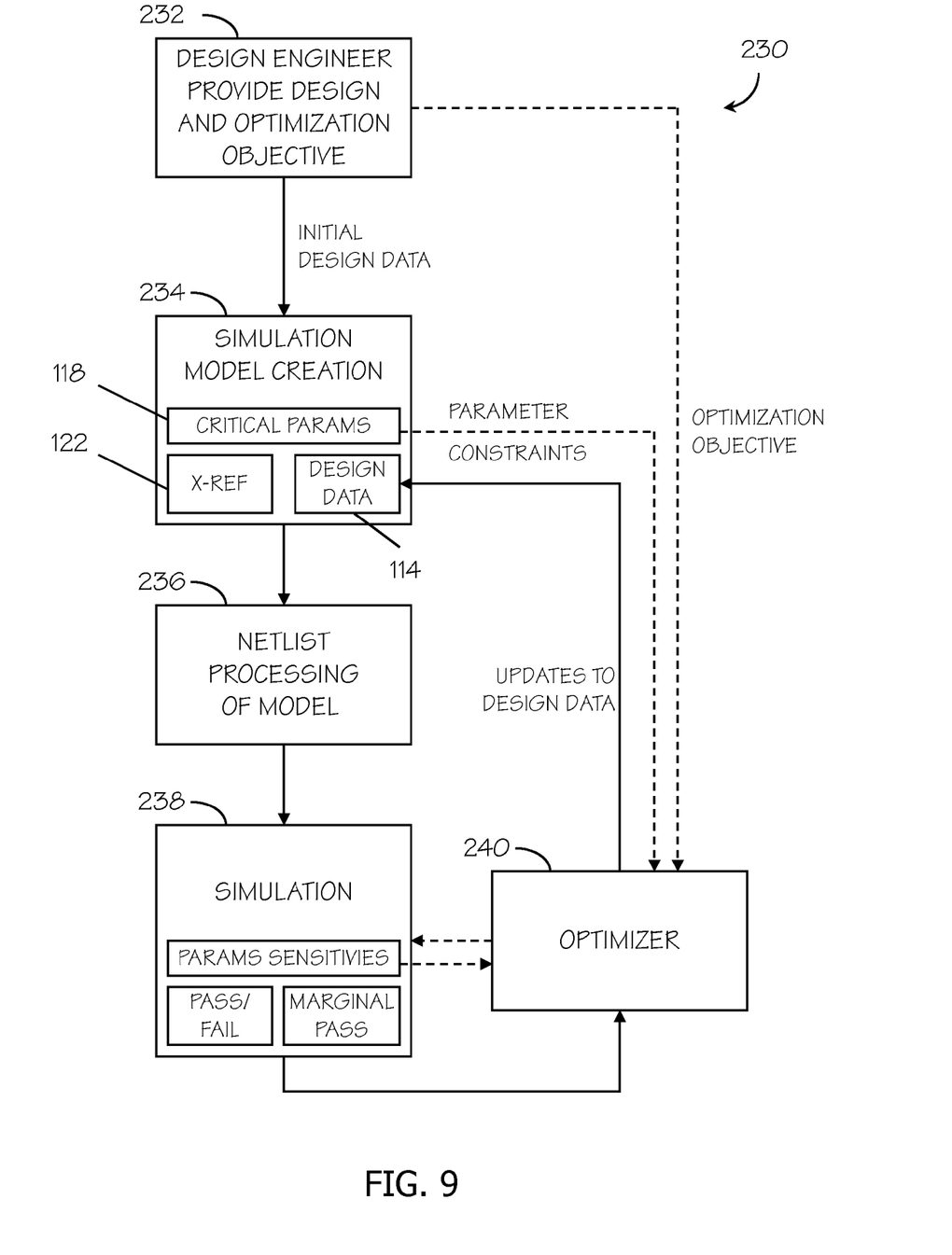
FIG. 9 is a block diagram of an automatic iterative process using a numerical optimizer.

In some embodiments, there may be "mini-loops" between the optimizer and simulator before any design data is changed by the optimizer. At the completion of the simulation and optimization cycle, the numerical optimizer attempts to meet the design objective established by the Design Engineer by making changes to the simulation model (block 234) within the constrains set up by the Design Engineer. This process continues until the objective of the design established by the Design Engineer is met, until it is determined that the objective cannot be met with the current inputs and design constraints, or until a set number of cycles through the loop has elapsed. Design Engineers may benefit from using numerical optimization, which is possible with the production of intermediate failure results being instantly available during a simulation rather than a post processing function.

Figure 10:
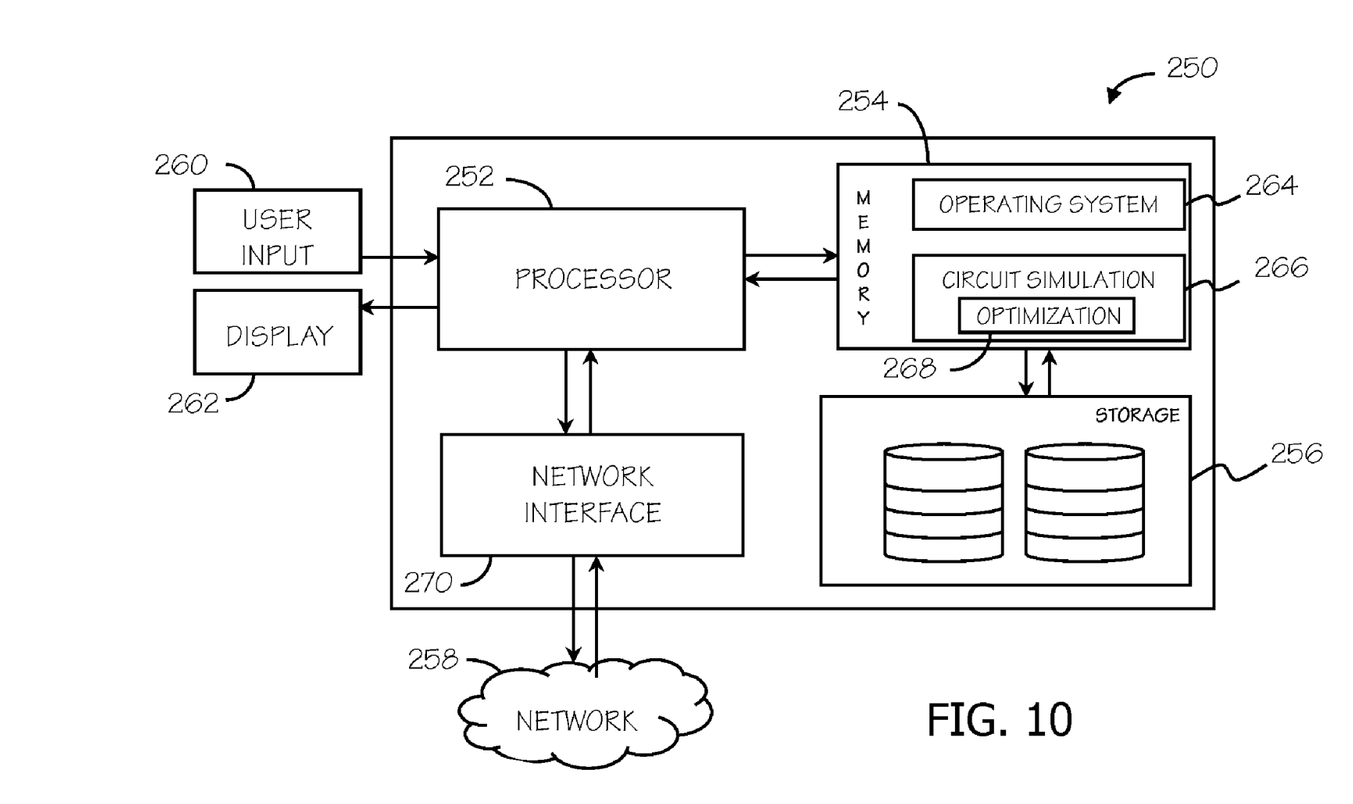
FIG. 10 is an exemplary hardware and software platform suitable for implementing embodiments of the invention.

FIG. 10 illustrates an exemplary hardware and software environment for an apparatus 250 suitable for implementing model based simulation and optimization consistent with embodiments of the invention. For the purposes of the invention, apparatus 250 may represent practically any computer, computer system, or programmable device, e.g., multi-user or single-user computers, desktop computers, portable computers and devices, handheld devices, network devices, mobile phones, etc. Apparatus 250 will hereinafter be referred to as a "computer" although it should be appreciated that the term "apparatus" may also include other suitable programmable electronic devices.

Computer 250 generally includes at least one processor 252 coupled to a memory 254. Memory 254 may represent the random access memory (RAM) devices comprising the main storage of computer 250, as well as any supplemental levels of memory, e.g., cache memories, non-volatile or backup memories (e.g. programmable or flash memories), read-only memories, etc. In addition, memory 254 may be considered to include memory storage physically located elsewhere in computer 250, e.g., any cache memory in a processor 252, as well as any storage capacity used as a virtual memory, e.g., as stored on a mass storage device 256 or another computer coupled to computer 250 via a network 258.

Computer 250 also typically receives a number of inputs and outputs for communicating information externally. For interface with a user or operator, computer 250 typically includes one or more user input devices 260 (e.g., a keyboard, a mouse, a trackball, a joystick, a touchpad, a keypad, a stylus, and/or a microphone, among others). Computer 250 may also include a display 262 (e.g., a CRT monitor, an LCD display panel, and/or a speaker, among others). The interface to computer 250 may also be through an external terminal connected directly or remotely to computer 250, or through another computer communicating with computer 250 via a network 258, modem, or other type of communications device.

Computer 250 operates under the control of an operating system 264, and executes or otherwise relies upon various computer software applications, components, programs, objects, modules, data structures, etc. (e.g. circuit simulator 266). Circuit simulator application 266, for example, may further include an optimizer 268. Computer 250 communicates on the network 258 through a network interface 270.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention as described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine (see FIG. 8), such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures above illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of simulating a circuit, the method comprising:
   representing a plurality of elements of the circuit by device models including pass/fail criteria;
   executing a circuit simulation program on a hardware implemented processor, the circuit simulation program configured to perform a plurality of sweeps to obtain simulation results from the device models in response to applied parameters;
   identifying with the circuit simulation program in the simulation results a plurality of failed elements that have failed and a second of marginally-passing elements that are about to fail based on the pass/fail criteria of the device models;
   identifying parameter values for each of the sweeps of the circuit simulation program;
   sorting the plurality of failed elements with the circuit simulation program according to a respective failure margin associated with a comparison of the parameter values with the pass/fail criteria;
identifying with the circuit simulation program a first list of the plurality of failed elements ranked according to the respective failure margin; and
identifying with the circuit simulation program a second list of the plurality of marginally-passing elements.

2. The method of claim 1, wherein the device models are based on testing of a physical form of the plurality of elements and failure criteria under failure conditions.

3. The method of claim 1, wherein the failures output during the simulation identify a critical path or component.

4. The method of claim 1, wherein the applied parameters include generating a series of ESD stimulus to the circuit, and the failures output during the simulation identify an ESD critical path and a failure mode.

5. The method of claim 1, further comprising:
analyzing the circuit by sweeping through and applying a plurality of critical design parameters, wherein the sweep uses a known parameter-failure cross-reference table; and
performing an optimization of the circuit including:
performing design iterations to optimize a circuit design of the circuit.

6. The method of claim 5, wherein the optimization is performed as an optimization loop utilizing a numerical optimizer.

7. The method of claim 1, wherein the circuit includes a portion of a circuit design with critical environmental variables for a local analysis.

8. The method of claim 1, wherein the circuit represents a full circuit design including critical environmental variables for a full chip analysis.

9. An apparatus comprising:
a processor; and
program code configured to be executed by the processor to simulate a circuit, the program code further configured to represent a plurality of elements of the circuit by device models including pass/fail criteria, to execute a circuit simulation program configured to perform a plurality of sweeps to obtain simulation results from the device models in response to applied parameters, to identify in the simulation results a plurality of failed elements that have failed and a second of marginally-passing elements that are about to fail based on the pass/fail criteria of the device models, to identify parameter values for each of the sweeps, to sort the plurality of failed elements according to a respective failure margin associated with a comparison of the parameter values with the pass/fail criteria, to identify a first list of the plurality of failed elements ranked according to the respective failure margin, and to identify a second list of the plurality of marginally-passing elements.

10. The apparatus of claim 9, wherein the device models are based on testing of a physical form of the plurality of elements and failure criteria under failure conditions.

11. The apparatus of claim 9, wherein the failures output during the simulation identify a critical path or component.

12. The apparatus of claim 9, wherein the applied parameters include generating a series of ESD stimulus to the circuit and the failures output during the simulation identify an ESD critical path and a failure mode.

13. The apparatus of claim 9, wherein the program code is further configured to analyze the circuit by sweeping through and applying a plurality of critical design parameters, wherein the sweep uses a known parameter-failure cross-reference table, and to perform an optimization of the circuit including performing design iterations to optimize a circuit design of the circuit.

14. The apparatus of claim 13, wherein the optimization is performed as an optimization loop utilizing a numerical optimizer.

15. The apparatus of claim 9, wherein the circuit includes a portion of circuit design with critical environmental variables for a local analysis.

16. The apparatus of claim 9, wherein the circuit represents a full circuit design including critical environmental variables for a full chip analysis.

17. A program product, comprising:
a non-transitory computer readable medium; and
a program code resident on the computer readable medium and configured to be executed by a hardware implemented processor to simulate a circuit, the program code further configured to represent a plurality of elements of the circuit by device models including pass/fail criteria, to execute a circuit simulation program configured to perform a plurality of sweeps to obtain simulation results from the device models in response to applied parameters, to identify in the simulation results a plurality of failed elements that have failed and a second of marginally-passing elements that are about to fail based on the pass/fail criteria of the device models, to identify parameter values for each of the sweeps, to sort the plurality of failed elements according to a respective failure margin associated with a comparison of the parameter values with the pass/fail criteria, to identify a first list of the plurality of failed elements ranked according to the respective failure margin, and to identify a second list of the plurality of marginally-passing elements.

18. The program product of claim 17, wherein the program code is further configured to analyze the circuit by sweeping through and applying a plurality of critical design parameters, wherein the sweep uses a known parameter-failure cross-reference table, and to perform an optimization of the circuit including performing design iterations to optimize a circuit design of the circuit.

19. The program product of claim 18, wherein the optimization is performed as an optimization loop utilizing a numerical optimizer.

20. The program product of claim 17, wherein the applied parameters include generating a series of ESD stimulus to the circuit and the failures output during the simulation identify an ESD critical path and a failure mode.

* * * * *